(12) United States Patent
Kao et al.

(10) Patent No.: US 11,215,408 B2
(45) Date of Patent: Jan. 4, 2022

(54) HEAT DISSIPATION DEVICE

(71) Applicant: AVerMedia Technologies, Inc., New Taipei (TW)

(72) Inventors: Jui-Hung Kao, New Taipei (TW); Yu-Chin Liu, New Taipei (TW); Wen-Tse Yan, New Taipei (TW)

(73) Assignee: AVERMEDIA TECHNOLOGIES, INC., New Taipei (TW)

( * ) Notice: Subject to any disclaimer, the term of this patent is extended or adjusted under 35 U.S.C. 154(b) by 74 days.

(21) Appl. No.: 16/711,589

(22) Filed: Dec. 12, 2019

(65) Prior Publication Data

US 2020/0208926 A1    Jul. 2, 2020

(30) Foreign Application Priority Data

Dec. 27, 2018    (TW) .................... 107147347

(51) Int. Cl.
*F28F 13/18*     (2006.01)
*F28F 13/08*     (2006.01)
*F28F 21/08*     (2006.01)

(52) U.S. Cl.
CPC ............. *F28F 13/18* (2013.01); *F28F 13/08* (2013.01); *F28F 21/081* (2013.01); *F28F 2215/08* (2013.01)

(58) Field of Classification Search
CPC .. F28F 3/046; F28F 3/048; F28F 13/18; F28F 2245/06; H01L 23/367; H01L 21/4871; H05K 7/20127; H05K 7/2039; H05K 7/209; H05K 7/20963; H05K 7/20854; F28D 2021/0029
See application file for complete search history.

(56) References Cited

U.S. PATENT DOCUMENTS

| | | | | |
|---|---|---|---|---|
| 3,285,333 A | * | 11/1966 | Johnson, Jr. .......... | F25B 23/003 165/133 |
| 3,982,527 A | * | 9/1976 | Cheng ..................... | F24S 10/75 126/690 |
| 4,313,426 A | * | 2/1982 | Niedermeyer .......... | F24S 23/74 126/661 |
| 5,368,094 A | * | 11/1994 | Hung ................... | H01L 23/4006 165/121 |
| 7,588,074 B1 | * | 9/2009 | White ....................... | E04H 7/30 165/166 |
| 8,939,683 B1 | * | 1/2015 | White ....................... | F28F 3/12 407/61 |

(Continued)

*Primary Examiner* — Jianying C Atkisson
*Assistant Examiner* — Jose O Class-Quinones
(74) *Attorney, Agent, or Firm* — McClure, Qualey & Rodack, LLP

(57) ABSTRACT

A heat dissipation device includes a heat conducting plate and a heat sink. The heat conducting plate has a first surface and a second surface opposite to each other. The heat sink is coupled to the first surface of the heat conducting plate. The heat sink includes a first peak portion, a second peak portion, a valley portion and a first curved surface. The first peak portion and the second peak portion are adjacent to each other. The valley portion is located between the first peak portion and the second peak portion. The first curved surface is coupled between the first peak portion and the valley portion. An extension line perpendicular to a corresponding tangent line of the first curved surface passes between the first peak portion and the second peak portion.

19 Claims, 5 Drawing Sheets

(56) References Cited

U.S. PATENT DOCUMENTS

| | | | |
|---|---|---|---|
| 10,448,538 B1* | 10/2019 | Gaul | H01Q 1/02 |
| 2003/0230751 A1* | 12/2003 | Harada | H01L 33/60 |
| | | | 257/80 |
| 2004/0040327 A1* | 3/2004 | Iida | H01L 23/4334 |
| | | | 62/259.2 |
| 2004/0129945 A1* | 7/2004 | Uemura | H01L 33/507 |
| | | | 257/98 |
| 2005/0152115 A1* | 7/2005 | Peng | H01L 23/3672 |
| | | | 361/703 |
| 2005/0189099 A1* | 9/2005 | Hanin | F28F 1/10 |
| | | | 165/181 |
| 2006/0034084 A1* | 2/2006 | Matsuura | H01L 33/507 |
| | | | 362/293 |
| 2006/0096742 A1* | 5/2006 | Bhatti | F28D 15/0266 |
| | | | 165/104.33 |
| 2007/0184229 A1* | 8/2007 | Jeong | B32B 3/30 |
| | | | 428/40.1 |
| 2008/0117500 A1* | 5/2008 | Narendran | H01L 33/504 |
| | | | 359/326 |
| 2009/0044407 A1* | 2/2009 | Blanco, Jr. | H01L 23/42 |
| | | | 29/890.03 |
| 2010/0091463 A1* | 4/2010 | Buresch | H01L 23/367 |
| | | | 361/718 |
| 2011/0128733 A1* | 6/2011 | Chen | F21V 7/0025 |
| | | | 362/235 |
| 2011/0297361 A1* | 12/2011 | Carbone | H01L 23/3672 |
| | | | 165/185 |
| 2012/0211214 A1* | 8/2012 | Phan | H01L 23/3677 |
| | | | 165/185 |
| 2012/0281167 A1* | 11/2012 | Nakatsuka | F28F 3/048 |
| | | | 349/69 |
| 2013/0168042 A1* | 7/2013 | Garlapati | F28D 9/0031 |
| | | | 165/51 |
| 2013/0250522 A1* | 9/2013 | Maxfield | H01L 23/42 |
| | | | 361/718 |
| 2015/0101785 A1* | 4/2015 | Ho | H01L 21/4882 |
| | | | 165/170 |
| 2015/0187679 A1* | 7/2015 | Ho | H01L 23/367 |
| | | | 257/690 |
| 2016/0029517 A1* | 1/2016 | Kim | H05K 7/20409 |
| | | | 361/710 |

* cited by examiner

HEAT DISSIPATION DEVICE

CROSS REFERENCE TO RELATED APPLICATIONS

This Non-provisional application claims priority under 35 U.S.C. § 119(a) on Patent Application No. 107147347 filed in Republic of China on Dec. 27, 2018, the entire contents of which are hereby incorporated by reference.

BACKGROUND

1. Technical Field

The present invention generally relates to a dissipation device, and more particularly, to a dissipation device based on a heat radiation mechanism.

2. Description of Related Art

With significant progress in electronic technology, most of electronic devices such as central processing units (CPU) or graphics processing units (GPU) have possessed high-speed processing capability. However, the higher speed such electronic devices work at, the greater power will be consumed. Therefore, such high-speed devices will undesirably produce huge thermal energy (also termed as "heat energy"), and considerable heat will be emitted. To avoid accumulation of the emitted heat which may deteriorate these electronic devices, skilled persons in this art usually utilize heat dissipation devices to discharge the emitted heat.

Specifically, conventional heat dissipation devices are usually free of external power and able to freely and passively perform heat dissipation. Accordingly, they are classified as "passive heat dissipation elements" in the field of electronic engineering, where "passive" means "free of external power".

In addition, conventional heat dissipation devices usually have a metal material which is less in weight, good at heat conducting and easy to be fabricated. Such a metal heat dissipation device may be attached to a heat emitting surface of a concerned object (i.e., electronic device which produces thermal energy and thus emits heat), and heat dissipation may be performed based on a mechanism of "composite heat-exchange". Furthermore, conventional heat dissipation devices usually have heat sink fins, which function based on mechanisms of "heat-conduction", "heat-transferring" or "heat-convection".

FIG. 1 is a schematic perspective view of a conventional heat dissipation device 10. Referring to FIG. 1, the heat dissipation device 10 includes a heat conducting plate 11, a plurality of heat sink fins 12 and a plurality of airflow channel 13 between each of the heat sink fins 12. The heat conducting plate 11 is for contacting the heat emitting surface of the concerned object, so that heat emitted by the concerned object can be delivered or transmitted to the whole heat dissipation device 10 through the heat conducting plate 11. Furthermore, the heat sink fins 12 are vertically disposed on the heat conducting plate 11, wherein each of the heat sink fins 12 is parallel with one another. With the aids of the heat sink fins 12, a larger surface area for the heat dissipation device 10 may be obtained, and better efficiency for heat dissipation may thus be achieved.

Except for "composite heat-exchange", "heat-conduction", "heat-transferring" and "heat-convection", another mechanism known as "heat-radiation" can be also employed. Regarding the mechanism of heat-radiation, firstly, heat may be absorbed by the heat dissipation device 10 and converted to electromagnetic radiation waves. Then, the electromagnetic radiation waves may be radiated and dissipated outwards from the heat dissipation device 10.

Heat-radiation can be performed without other conducting medium, and specifically, can be activated as temperature of the heat radiating material gets higher than absolute zero degree. Currently, a material of graphene is usually selected for performing heat-radiation, which may be coated, sputtered or sprayed on the outer surface of the heat dissipation device 10.

However, for the conventional heat dissipation device 10, each of the heat sink fins 12 is parallel with one another. Which means, each of the heat sink fins 12 may directly face to an adjacent one (i.e., in a manner of face-to-face). Accordingly, when performing heat-radiation, heat radiated from one of the heat sink fins 12 will be mostly blocked or re-absorbed by the adjacent one, and heat dissipating efficiency may suffer severely. The foregoing identifies one of technical problems for the conventional heat dissipation device 10.

Given the above, it may be therefore desirable to have an improved heat dissipation device based on heat-radiation mechanism, which can address the above-identified technical problem and thus enhance efficiency of heat dissipation.

SUMMARY OF THE INVENTION

It is therefore an object of the present invention to provide a heat dissipation device based on a heat-radiation mechanism, which is able to enhance heat dissipating efficiency taking advantage of heat-radiation.

To achieve the above, the present invention is to provide a heat dissipation device. The heat dissipation device comprises a heat conducting plate and a heat sink. The heat conducting plate has a first surface and a second surface opposite to each other, and the heat sink is coupled to the first surface of the heat conducting plate. The heat sink comprises a first peak portion, a second peak portion, a valley portion and a first curved surface. The second peak portion is adjacent to the first peak portion, the valley portion is located between the first peak portion and the second peak portion, while the first curved surface is coupled between the first peak portion and the valley portion. Furthermore, an extension line perpendicular to a corresponding tangent line of the first curved surface passes between the first peak portion and the second peak portion.

In one embodiment of the present invention, the first curved surface has a curved profile being a portion of a first circle, the center of the first circle is located within a first predefine region, the first predefine region centers at the second peak portion and expands by a radius equaling half the radius of the first circle.

In one embodiment of the present invention, the radius of the first predefined region is smaller than or equal to the distance between the first peak portion and the second peak portion.

In one embodiment of the present invention, the center of the first circle is located on a virtual connection line between the first peak portion and the second peak portion.

In one embodiment of the present invention, the radius of the first circle is smaller than or equal to the distance between the center of the first circle and the valley portion.

In one embodiment of the present invention, the heat sink further comprises an extended surface, being coupled between the first peak portion and the first curved surface, and/or coupled between the first curved surface and the valley portion.

In one embodiment of the present invention, the extended surface takes a plane shape, a curved shape or a wavy shape.

In one embodiment of the present invention, the heat sink further comprises a second curved surface, being coupled between the second peak portion and the valley portion, wherein an extension line perpendicular to a tangent line of the second curved surface passes between the first peak portion and the second peak portion.

In one embodiment of the present invention, the second curved surface has a curved profile being a portion of a second circle, the center of the second circle is located within a second predefine region, the second predefine region centers at the first peak portion and expands by a radius equaling half the radius of the second circle.

In one embodiment of the present invention, the radius of the first circle is different from that of the second circle in length.

In one embodiment of the present invention, the radius of the second predefined region is smaller than or equal to the distance between the first peak portion and the second peak portion.

In one embodiment of the present invention, the center of the second circle is located on a virtual connection line between the first peak portion and the second peak portion.

In one embodiment of the present invention, the radius of the second circle is smaller than or equal to the distance between the center of the second circle and the valley portion.

In one embodiment of the present invention, the heat sink further comprises an extended surface, being coupled between the second peak portion and the second curved surface, and/or coupled between the second curved surface and the valley portion.

In one embodiment of the present invention, the extended surface takes a plane shape, a curved shape or a wavy shape.

In one embodiment of the present invention, the first peak portion, the second peak portion or the valley portion of the heat sink has a shape selected from a plane shape, a curved shape or a tipped shape, or a combination thereof.

In one embodiment of the present invention, the heat conducting plate and/or the heat sink include a heat radiating material.

In one embodiment of the present invention, the heat dissipation device of further comprises a heat radiating layer, covering at least portions of outer surface of the heat conducting plate and the heat sink.

In summary, the heat dissipation device of the present invention features that, curved surfaces are provided for the heat sink, being disposed between corresponding peak portions and valley portions. Furthermore, each of the curved surfaces may have a curved profile, being a portion of a circle centering between the first peak portion and the second peak portion. Thereby, heat radiated from the curved surfaces of the heat sink, which is in the form of radiated electromagnetic waves, may travel along transmission paths between the first peak portion and the second peak portion of the heat sink. Which means, any portion of body of the heat sink will not block or re-absorb the radiated heat, and heat dissipating efficiency may thus be improved.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 1:
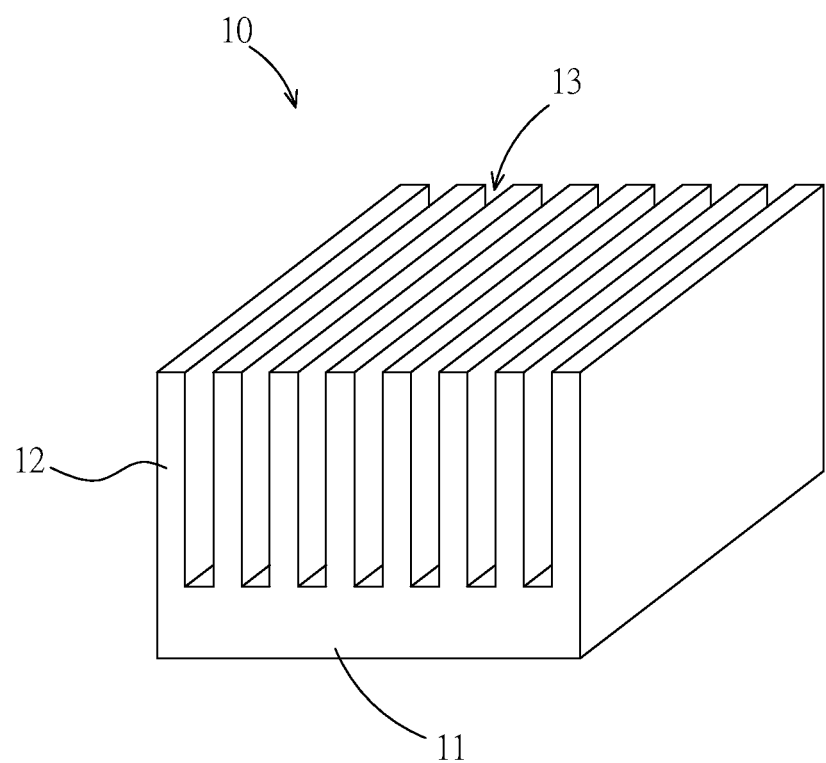
FIG. 1 is a schematic perspective view of a conventional heat dissipation device.
Figure 2:
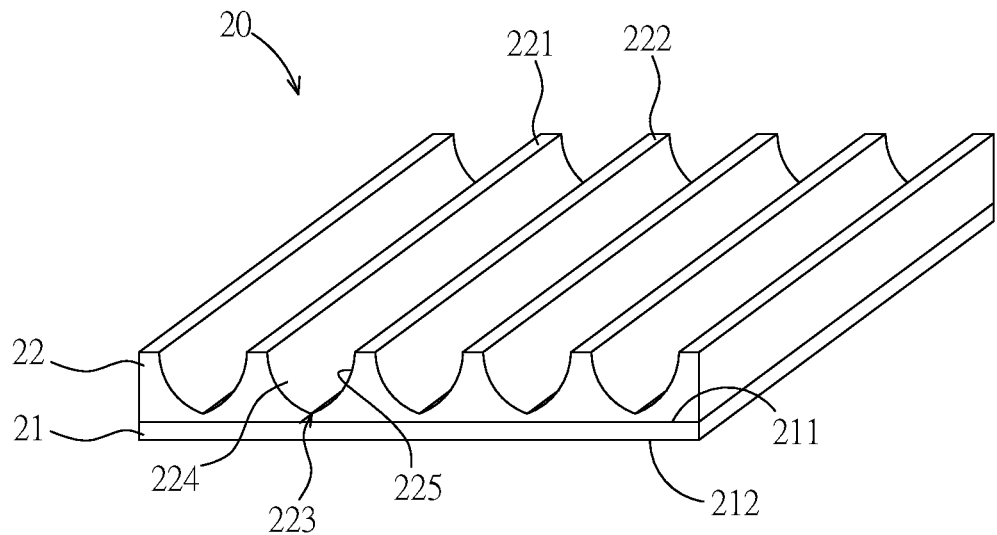
FIG. 2 is a schematic perspective view of a heat dissipation device according to a preferred embodiment of the present invention.

FIG. 2 is schematic perspective view of a heat dissipation device 20 according to a preferred embodiment of the present invention. Referring to FIG. 2, the heat dissipation device 20 may include a heat conducting plate 21 and a heat sink 22. In one example, each of the heat conducting plate 21 and the heat sink 22 may be an individual component, and may then be combined or assembled to form the whole heat dissipation device 20. In another example, alternatively, the heat conducting plate 21 together with the heat sink 22 may be formed by a single process, being in the form of one-piece. Hereinafter, an embodiment will be provided in which the heat conducting plate 21 together with the heat sink 22 are formed as an integral whole (in the form of one-piece).

Specifically, the heat dissipation device 20 may operate based on heat-radiation (also termed as "thermal-radiation") mechanism. Accordingly, both the heat conducting plate 21 and heat sink 22 may include a heat radiating material, such as porous alumina, which can perform heat radiation well. Furthermore, the outer surface of the heat conducting plate 21 and heat sink 22 may be covered (by means of coating or spraying) with a heat radiating layer having a material of liquid ceramic or graphene. The heat radiating layer may cover the whole outer surface of the heat conducting plate 21 and heat sink 22, or selectively cover specific or designated portions of their outer surface. For example, only portions of the first curved surface 224 and the second curved surface 225 of the heat sink 22 may be covered with the heat radiating layer, as will be described later.

Referring to FIG. 2 again, the heat conducting plate 21 may have a first surface 211 and a second surface 212 opposite to each other. Furthermore, the heat sink 22 may be coupled to or connected with the first surface 211 of the heat conducting plate 21. In one example, the heat sink 22 may directly contact (and then secured or fixed to) the first surface 211 of the heat conducting plate 21. In other examples, the heat sink 22 may be indirectly coupled to the first surface 211 of the heat conducting plate 21 through a heat conducting path (the heat conducting path may comprise other medium or elements). In still other examples, the heat sink 22 and the heat conducting plate 21 may be portions of one single body (that is, the heat sink 22 and the heat conducting plate 21 are formed as an integral whole).

The heat sink 22 may include a plurality of fins (also termed as "heat sink fins", "heat dissipating fins" or "cooling fins") each of which may be parallel with one another. The heat sink 22 may be composed of at least a plurality of peak portions, valley portions and curved surfaces, and wherein, each fin of the heat sink 22 may have one corresponding peak portion. Hereinafter, the above peak portions, valley portions and curved surfaces will be exemplarily described as a first peak portion 221, a second peak portion 222, a valley portion 223, a first curved surface 224 and a second curved surface 225.

Specifically, the first peak portion 221 and the second peak portion 222 may be disposed adjacent to each other, that is, the first peak portion 221 and the second peak portion 222 may correspond to two adjacent fins of the heat sink 22, respectively. Furthermore, the valley portion 223 may be located between the first peak portion 221 and the second peak portion 222, in other words, the valley portion 223 may be located between two adjacent fins of the heat sink 22. Moreover, the first curved surface 224 may be coupled between the first peak portion 221 and the valley portion 223, while the second curved surface 225 may be coupled between the second peak portion 222 and the valley portion 223. Which means, the first curved surface 224 may be opposite to the second curved surface 225.

Figure 3:
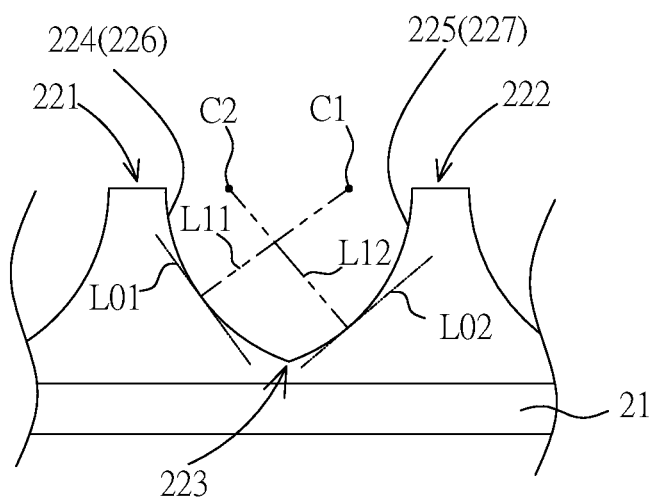
FIG. 3 is a schematic side view illustrating portions of the heat dissipation device of FIG. 2.

FIG. 3 is a schematic side view illustrating portions of the heat dissipation device 20 of FIG. 2. Referring to both FIGS. 2 and 3, the first curved surface 224 may have a first curved profile 226 (also termed as "first curved lateral" or "first curved side face") as its profile or lateral. Likewise, the second curved surface 225 may have a second curved profile 227 (also termed as "second curved lateral" or "second curved side face") as its profile or lateral. Furthermore, the first curved profile 226 and the second curved profile 227 may intersect at the valley portion 223.

The first curved profile 226 may be a portion of a first circle, wherein the first circle may have a first center $C1$ and a first radius $L11$. Furthermore, an extension line, which is a normal line perpendicular to a tangent line $L01$ at a point of the first curved profile 226, may pass between the first peak portion 221 and the second peak portion 222. In one example, the extension line may overlap the first radius $L11$ and hence pass the first center $C1$ of the first circle.

The first center $C1$ of the first circle may be located within a first predefined region (also termed as "first predefined range" or "first predefined area"). The first predefined region, which may be a circular region, may take the second peak portion 222 as its center and take a proportion (such as, half the length) of the first radius $L11$ as its radius. More particularly, the radius of the first predefined region may be smaller than or equal to the distance between the first peak portion 221 and the second peak portion 222, so that the first predefined region may have a preferable, reasonable and practical scope or coverage. In other words, taking the second peak portion 222 as its center and originating from the second peak portion 222, the first predefined region may expand toward the first peak portion 221 so as to obtain its scope or coverage. And wherein, any portion of body of the heat sink 22 should not lie in or fall into the scope or coverage of the first predefined region. That is, the first predefined region should exclude the body of the heat sink 22 from its scope or coverage.

In addition, the first center $C1$ of the first circle may selectively vary its location so as to meet variety of requirements. Different locations for the first center $C1$ may result in different curvatures or different areas for the first curved surface 224, and various levels of heat dissipation may thus be arrived.

Going into more details, the first center $C1$ may be located between the first peak portion 221 and the second peak portion 222, and preferably located closer to the second peak portion 222. Consequently, any of the extension lines (i.e., normal lines, which are perpendicular to corresponding tangent lines $L01$ of the first curved profile 226) may exactly pass through the first center $C1$ without contacting any portion of body of the heat sink 22. In view of the above, as heat outward radiates from the first curved surface 224 in the manner of infrared-ray or far-infrared-ray, the radiated heat may travel along the extension lines. Which means, the radiated heat may be directly transmitted or delivered into atmosphere without being blocked or re-absorbed by any portion of body of the heat sink 22. Accordingly, efficiency for heat dissipation may be greatly enhanced, which is the main technical effect of the present invention.

On the other hand, the second curved surface 225 may have a featured structure and technical effect similar to the first curved surface 224, which are set forth as follows. Specifically, a second circle may be defined by a second center $C2$ and a second radius $L12$, and the second curved profile 227 may be a portion of the second circle as defined. Furthermore, similar to the extension lines associated with the first curved profile 226, extension lines associated with the second curved profile 227 (i.e., normal lines, being perpendicular to corresponding tangent lines $L02$), may also pass between the first peak portion 221 and the second peak portion 222. In one example, the extension line may overlap the second radius $L12$ and hence pass the second center $C2$ of the second circle.

Moreover, a circular second predefined region (also termed as "second predefined range" or "second predefined area") may be defined in the same fashion as the first predefined region. Wherein, the second predefined region may center at the first peak portion 221 and expand by a radius equaling half the second radius $L12$. In addition, the second center $C2$ may restrict its location within the second predefined region. More particularly, a preferable scope or coverage may be obtained for the second predefined region by adjusting length of its radius. For example, the second predefined region may have a radius smaller than or equal to the distance between the first peak portion 221 and the second peak portion 222. Given the above, taking the first peak portion 221 as its center (or starting point) and originating therefrom, then expanding toward the second peak portion 222, the second predefined region may reach a desirable scope or coverage which excludes any portion of body of the heat sink 22. In the present embodiment, the first radius $L11$ may be equal to the second radius $L12$ in length. As a result, the first curved surface 224 may be symmetrical to the second curved surface 225.

Like the first center $C1$ of the first circle, location of the second center $C2$ of the second circle may be also varied on various demands. Second center $C2$ of different locations may lead to second curved surface 225 of different curvatures or areas, which may achieve various measures of heat dissipating efficiency. In one example, both the first center C1 and the second center C2 may be exactly located at the midpoint of a virtual connection line between the first peak portion 221 and the second peak portion 222. That is, the first center C1 and the second center C2 may be located at the same position. Consequently, the first curved profile 226 in conjunction with the second curved profile 227 may thus form a semicircle.

To further elaborate, the second curved surface 225 may work on the same principle as the first curved surface 224. Like the first center C1, the second center C2 which defines the second curved surface 225, may be located between the first peak portion 221 and the second peak portion 222 and preferably located closer to the first peak portion 221. As a result, any of the extension lines associated with the second curved profile 227 (which is perpendicular to a corresponding tangent line L02), may pass through the second center C2 without contacting any portion of body of the heat sink 22. Based on the above principle and behaving like the first curved surface 224, the second curved surface 225 may directly and completely radiate heat (in the form of infrared-ray or far-infrared-ray) into atmosphere, without being blocked or re-absorbed by any portion of body of the heat sink 22.

Figure 4:
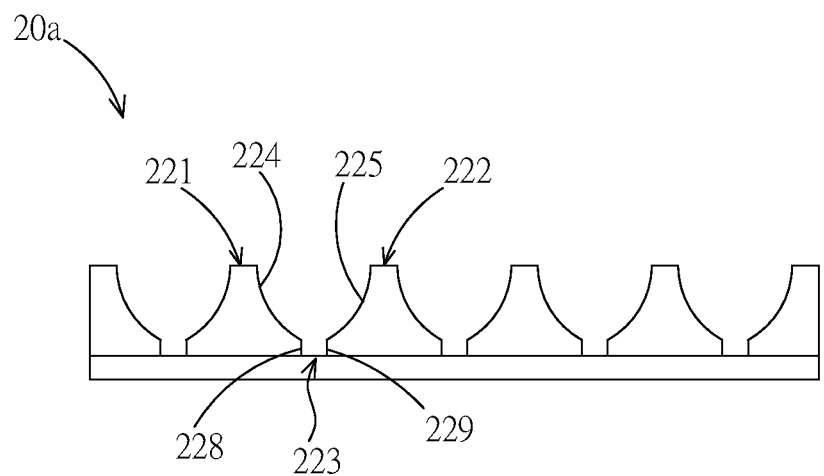
FIG. 4 is a schematic side view of a various type of heat dissipation device according to a preferred embodiment of the present invention.

FIG. 4 is a schematic side view of a various type of heat dissipation device 20a according to a preferred embodiment of the present invention. Referring to FIG. 4, for such type of heat dissipation device 20a, the heat sink 22 may further include at least one extended surface which may take a plane shape, a curved shape or a wavy shape.

The extended surface(s) are disposed in order to (but not limited to) improve appearance of the heat dissipation device 20a, or to consolidate and strengthen structure thereof. In addition, efficiency for heat dissipation may be further enhanced with the help of the extended surface(s). In the following descriptions, an embodiment will be provided in which the extended surface(s) have a plane shape.

As shown in FIG. 4, the plane-shaped extended surfaces of the heat dissipation device 20a may direct to a first plane surface 228 and a second plane surface 229. In one example, the first plane surface 228 may be coupled between the first curved surface 224 and the valley portion 223, while the second plane surface 229 may be coupled between the second curved surface 225 and the valley portion 223. In another example, arrangements of the first and second plane surfaces 228 and 229 may be modified, so that the first plane surface 228 may be coupled between the first peak portion 221 and the first curved surface 224, while the second plane surface 229 may be coupled between the second peak portion 222 and the second curved surface 225.

More particularly, slope of the first plane surface 228 and/or the second plane surface 229 may be varied so as to suit various design concerns. By varying their slopes, the first plane surface 228 and/or the second plane surface 229 may have various angles of 0 to 90 degrees with respect to the first surface 211 of the heat conducting plate 21. In one example, the first plane surface 228 and/or the second plane surface 229 may have a first slope to result in a zero-degree angle with respect to the first surface 211 of the heat conducting plate 21. Namely, the first plane surface 228 and/or the second plane surface 229 may be parallel with the first surface 211 of the heat conducting plate 21. In another example, the first plane surface 228 and/or the second plane surface 229 may have a second slope that leads to a 90-degree angle with respect to the first surface 211 of the heat conducting plate 21. With the second slope and hence the 90-degree angle, the first plane surface 228 and/or the second plane surface 229 may make themselves perpendicular to the first surface 211 of the heat conducting plate 21, as shown in FIG. 4.

To elaborate more, other than the embodiment illustrated by FIG. 4, the first plane surface 228 and the second plane surface 229 may be both replaced with curved surfaces (not shown). That is, each of the extended surfaces of the heat sink 22 may take a curved shape. On the other hand, for a various type of extended surfaces, only one of the first plane surface 228 and the second plane surface 229 may be replaced with a curved surface, while the other one may remain a plane shape, namely, the extended surfaces of the same heat dissipation device 20a may have both plane shape and curved shape.

When any one of the extended surfaces takes a curved shape, for example, the first plane surface 228 is replaced with a curved surface, its curvature may be different from those of the first curved surface 224 and/or the second curved surface 225. In addition, for still another type, the curved extended surfaces may be further shaped as a plurality of continuous or successive waves.

Now regarding the shape of the valley portion 223. When plane-shaped extended surfaces are arranged (i.e., the first plane surface 228 and the second plane surface 229 are arranged), the corresponding valley portion 223 may be also plane-shaped, as shown in FIG. 4. Nevertheless, not limited to plane shape, in other examples, the valley portion 223 may be curve-shaped (not shown). On the other hand, when curve-shaped extended surfaces are arranged (i.e., all extended surfaces are curved), the corresponding valley portion 223 may be tip-shaped. As well, if the heat sink 22 does not include any extended surface as shown in FIG. 2, the corresponding valley portion 223 may be also tipped. In still other examples, different types of valley portions taking a combination of tipped shape, curved shape and plane shape, may be jointly disposed in the same heat dissipation device 20.

Figure 5:
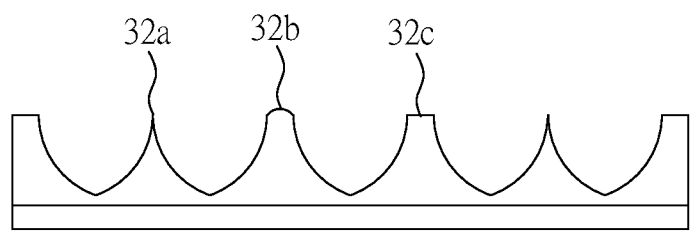
FIG. 5 is a schematic side view of various types of peak portions according to a preferred embodiment of the present invention.

Similarly, the first and second peak portions 221 and 222 may have various shapes, such as tipped shape, curved shape or plane shape. For example, referring to FIG. 5 which illustrates various types of peak portions (with a schematic side view) according to a preferred embodiment of the present invention, the peak portion 32a may have a tipped shape, the peak portion 32b may have a curved shape, while the peak portion 32c may have a plane shape. In still other examples, different types of peak portions taking a combination of tipped shape, curved shape and plane shape, may be jointly disposed in the same heat dissipation device 20.

Figure 6:
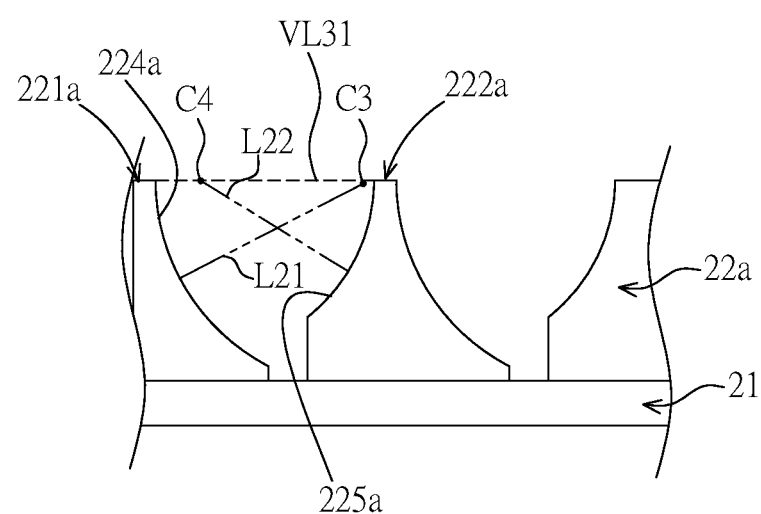
FIG. 6 is a schematic side view illustrating portions of an asymmetric type of heat dissipation device according to a preferred embodiment of the present invention.

The foregoing embodiments illustrated by FIGS. 2 to 5 are provided where the first radius L11 is equal to the second radius L12. Not limited to the above, the first and second radiuses L11 and L12 may be different in length for other embodiments as described below. Specifically, FIG. 6 is a schematic side view illustrating portions of an asymmetric type of heat dissipation device according to a preferred embodiment of the present invention. Referring to FIG. 6, the distance from the first center C3 to the second peak portion 222a may be shorter than that from the second center C4 to the first peak portion 221a. Accordingly, the first radius L21 (corresponding to the first curved surface 224a) may be longer than the second radius L22 (corresponding to the second curved surface 225a). Thereby, the first curved surface 224a is not symmetric to the second curved surface 225a, which results in an asymmetric type of heat dissipation device.

Similar to the first curved surface 224 in FIG. 3, the first curved surface 224a in FIG. 6 also features that, each of its extension lines (i.e., normal lines) will pass through the first center C3 without contacting any portion of body of the heat sink 22a. Thereby, radiated heat from the first curved surface 224a, which may be transmitted along the extension lines thereof, will not be blocked or re-absorbed by the body of the heat sink 22a.

Likewise, each of extension lines (i.e., normal lines) of the second curved surface 225a will pass through the second center C4 without contacting any portion of body of the heat sink 22a. Thereby, when taking these extension lines as transmission paths and keeping these transmission paths away from any portion of body of the heat sink 22a, the second curved surface 225a can freely transmit heat and thus increase heat dissipating efficiency.

In addition, the foregoing embodiments illustrated by FIGS. 2 to 5 are provided where the first center C1 and the second center C2 are both located on a virtual connection line between the first peak portion 221 and the second peak portion 222. Nevertheless, not limited to the above arrangement, one of (or both) the first center C1 and the second center C2 may deviate from this virtual connection line. For example, as shown in FIG. 6, the second center C4 may be located on the virtual connection line VL31 between the first peak portion 221a and the second peak portion 222a, while the first center C3 may slightly deviate from the virtual connection line VL31. In this manner, the first curved surface 224a and the second curved surface 225a may have surface areas of different amounts.

Figure 7:
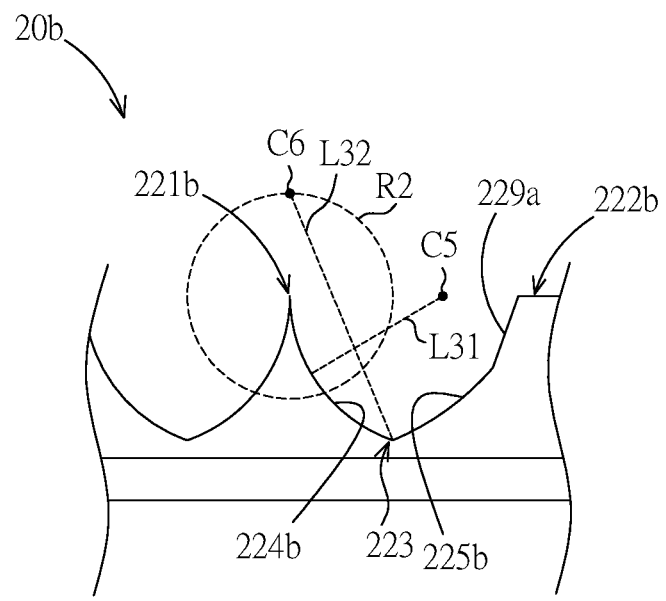
FIG. 7 is a schematic side view illustrating portions of still another type of heat dissipation device according to a preferred embodiment of the present invention.

FIG. 7 is a schematic side view illustrating portions of still another type of heat dissipation device 20b according to a preferred embodiment of the present invention. Referring to FIG. 7, a first circle (not shown) may be defined based on a first center C5 and a first radius L31, and the first curved surface 224b may then be defined with its profile being a portion of the first circle. Furthermore, the first center C5 may be located within a first predefined region (not shown). Wherein, the first predefined region is also a circular region, which centers at the second peak portion 222b and expands by a radius equaling half the first radius L31.

Likewise, a second circle (not shown) may be derived from a second center C6 and a second radius L32, and a portion of such second circle may be taken as the second curved surface 225b. Furthermore, a second predefined region R2, which is also circular, may be derived from the first peak portion 221b (as its center) and half the distance between the first peak portion 221b and the second peak portion 222b (as its radius). Moreover, the second center C6 may be bounded by the circular second predefined region R2.

Additionally, the heat sink of the heat dissipation device 20b may further include a second plane surface 229a, which may be coupled between the second curved surface 225b and the second peak portion 222b. With the above structure (i.e., the first and second curved surfaces 224b and 225b with variously located centers and radiuses, in conjunction with the additional second plane surface 229a), the heat dissipation device 20b may attain a larger surface area and hence a larger effective area for radiating heat.

Nevertheless, for some cases or applications, the largest surface area for the heat dissipation device would not be the best choice. In those cases, best efficiency for heat dissipation can be achieved when the heat dissipation device has a sub-optimal surface area (which is slightly smaller than the largest surface area). To suit those cases, arrangements for the first and second curved surfaces 224b and 225b as well as the additional second plane surface 229a may be adjusted or modified to reach the sub-optimal surface area.

Figure 8:
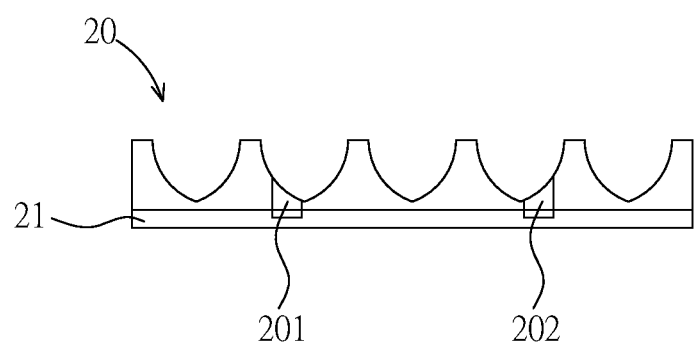
FIG. 8 is a schematic side view of a heat dissipation device with openings, according to a preferred embodiment of the present invention.

FIG. 8 is a schematic side view of the heat dissipation device 20 with openings, according to a preferred embodiment of the present invention. Referring to FIG. 8, the heat dissipation device 20 may further include openings 201 and 202, which may be formed in the heat sink 22 and the heat conducting plate 21, and may penetrate the heat conducting plate 21. With the aids of the openings 201 and 202, the heat dissipation device 20 may be connected with or coupled to a heat emitting surface of a concerned object.

In one example, the openings 201 and 202 may be screw holes, so as to secure or fix the heat dissipation device 20 to the heat emitting surface of the concerned object by screws. In other examples, the heat dissipation device 20 may be attached to the heat emitting surface of the concerned object by heat conducting glue or heat dissipating grease.

In summary, the heat dissipation device of the present invention features that, curved surfaces are provided for the heat sink, being disposed between corresponding peak portions and valley portions. Furthermore, each of the curved surfaces may have a curved profile, being a portion of a circle centering between the first peak portion and the second peak portion. Moreover, for each point along the curved profile, a corresponding extension line (i.e., a normal line, which is perpendicular to a tangent line at that point) may pass through the center of the above-identified circle. In other words, for each point along the curved profile, the corresponding extension line may pass between the first and second peak portions without contacting any portion of the heat sink.

In view of the above, heat radiated from the curved surfaces of the heat sink, which is in the form of radiated electromagnetic waves (such as infrared-ray or far-infrared-ray), may travel along the extension lines between the first peak portion and the second peak portion. Thereby, any portion of body of the heat sink 22 will not block or re-absorb the radiated heat, and heat dissipating efficiency may thus be improved.

Except for the application of heat dissipation, the heat dissipation device of the present invention may be also applied or utilized for waste heat recycling, thermal energy conduction or heaters.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A heat dissipation device, comprising:
    a heat conducting plate, having a first surface and a second surface opposite to each other; and
    a heat sink, being coupled to the first surface of the heat conducting plate, comprising:
    a first peak portion;
    a second peak portion, being adjacent to the first peak portion;
    a valley portion, being located between the first peak portion and the second peak portion; and
    a first curved surface, being coupled between the first peak portion and the valley portion, wherein an extension line perpendicular to a corresponding tangent line of the first curved surface passes between the first peak portion and the second peak portion, and having a curved profile being a portion of a first circle, the center of the first circle is located within a first predefine region, the first predefine region centers at the second peak portion and expands by a radius equaling half the radius of the first circle.

2. The heat dissipation device of claim 1, wherein the radius of the first predefined region is smaller than or equal to the distance between the first peak portion and the second peak portion.

3. The heat dissipation device of claim 2, wherein the center of the first circle is located on a virtual connection line between the first peak portion and the second peak portion.

4. The heat dissipation device of claim 2, wherein the radius of the first circle is smaller than or equal to the distance between the center of the first circle and the valley portion.

5. The heat dissipation device of claim 1, wherein the center of the first circle is located on a virtual connection line between the first peak portion and the second peak portion.

6. The heat dissipation device of claim 1, wherein the radius of the first circle is smaller than or equal to the distance between the center of the first circle and the valley portion.

7. The heat dissipation device of claim 1, wherein the heat sink further comprises:
   an extended surface, being coupled between the first peak portion and the first curved surface, and/or coupled between the first curved surface and the valley portion.

8. The heat dissipation device of claim 1, wherein the heat sink further comprises:
   a second curved surface, being coupled between the second peak portion and the valley portion, wherein an extension line perpendicular to a corresponding tangent line of the second curved surface passes between the first peak portion and the second peak portion.

9. The heat dissipation device of claim 8, wherein the second curved surface has a curved profile being a portion of a second circle, the center of the second circle is located within a second predefine region, the second predefine region centers at the first peak portion and expands by a radius equaling half the radius of the second circle.

10. The heat dissipation device of claim 9, wherein the radius of the first circle is different from that of the second circle in length.

11. The heat dissipation device of claim 9, wherein the radius of the second predefined region is smaller than or equal to the distance between the first peak portion and the second peak portion.

12. The heat dissipation device of claim 11, wherein the center of the second circle is located on a virtual connection line between the first peak portion and the second peak portion.

13. The heat dissipation device of claim 11, wherein the radius of the second circle is smaller than or equal to the distance between the center of the second circle and the valley portion.

14. The heat dissipation device of claim 9, wherein the center of the second circle is located on a virtual connection line between the first peak portion and the second peak portion.

15. The heat dissipation device of claim 9, wherein the radius of the second circle is smaller than or equal to the distance between the center of the second circle and the valley portion.

16. The heat dissipation device of claim 8, wherein the heat sink further comprises:
   an extended surface, being coupled between the second peak portion and the second curved surface, and/or coupled between the second curved surface and the valley portion.

17. The heat dissipation device of claim 16, wherein the extended surface takes a plane shape, a curved shape or a wavy shape.

18. The heat dissipation device of claim 1, wherein the heat conducting plate and/or the heat sink include a heat radiating material.

19. The heat dissipation device of claim 1, further comprises:
   a heat radiating layer, covering at least portions of outer surface of the heat conducting plate and the heat sink.

* * * * *